United States Patent [19]

Endo et al.

[11] Patent Number: 5,012,276

[45] Date of Patent: Apr. 30, 1991

[54] IMAGE RECORDING APPARATUS

[75] Inventors: Yoshinori Endo, Toyota; Kenji Sakakibara, Ichinomiya, both of Japan

[73] Assignee: Brother Kogyo Kabushiki Kaisha, Japan

[21] Appl. No.: 395,359

[22] Filed: Aug. 17, 1989

[30] Foreign Application Priority Data

Aug. 19, 1988 [JP] Japan ................................ 63-206875

[51] Int. Cl.⁵ .............................................. G03B 27/32
[52] U.S. Cl. .......................................... 355/27; 355/35
[58] Field of Search ..................... 355/27, 28, 32, 35, 355/38, 69, 67, 71; 430/138

[56] References Cited

U.S. PATENT DOCUMENTS

| | | | |
|---|---|---|---|
| 4,008,962 | 2/1977 | Nepper | 355/32 X |
| 4,176,946 | 12/1979 | Takahashi | 355/38 |
| 4,806,986 | 2/1989 | Tokuda | 355/38 |
| 4,860,059 | 8/1989 | Terashita | 355/38 |

Primary Examiner—L. T. Hix
Assistant Examiner—Khanh Dang
Attorney, Agent, or Firm—Oliff & Berridge

[57] ABSTRACT

An image recording apparatus for recording an image of an original on a photosensitive recording medium. At an exposure zone, a latent image corresponding to the original image is formed on the photosensitive recording medium through filters. The filters provide insufficient spectral transmission characteristics, yet resultant output image has sufficient quality by controlling light irradiation amount from a light source or by controlling an exposure speed in response to insertion amounts of the filters with respect to an optical path.

5 Claims, 2 Drawing Sheets

IMAGE RECORDING APPARATUS

BACKGROUND OF THE INVENTION

The present invention relates to an image recording apparatus such as a copying machine, and more particularly, to a type thereof capable of controlling light exposure amount of exposure speed in order to compensate spectral transmission characteristic of an optical filter.

In one conventional image recording apparatus, a recording medium is of transfer type recording medium such as a photosensitive sheet which comprises a microcapsule sheet (first image recording medium) and a developer sheet (second image recording medium). More specifically, in the transfer type recording mediums, the developer material is coated on a separate substrate as a separate developer or copy sheet. The first image recording medium comprises a photosensitive pressure sensitive recording medium provided with microcapsules which encapsulate therein a first material (chromogenic material or dye precursor) having first and second phases dependent on light exposure. The second image recording medium comprises the developer medium provided with a second material (developer material) which provides an output image upon reaction with the first material. The developer sheet includes a base substrate, the developer material layer and a surface resin layer. Such image recording medium is disclosed in, for example, U.S. Pat. No. 4,399,209 and Japanese Patent Application Kokai No. 58-88739.

As is well known, the image recording apparatus of this type irradiates light onto an original and a light reflected from the original or transmitted therethrough passes through an optical system such as a reflection mirror, a filter and lenses, and is focused on the photosensitive recording medium at an exposure unit. As a result, a latent image is formed on the photosensitive recording medium upon photocuring the light exposed microcapsules. Then, the light-exposed photosensitive recording medium is superposed with a developer sheet, and these sheets are pressed together at a pressure developing unit, so that non photo-cured microcapsules are ruptured to react the chromogenic material with the developer material, to thereby provide an output image on the developer sheet. After the pressure developing operation, the developer sheet is delivered to a thermal fixing unit where the output image is thermally fixed and glossy output image is obtained.

In a conventional image recording apparatus, optical filters are selectively used for reproducing a color image on the photosensitive pressure sensitive recording medium. When light passes through the filter, the light may be partly absorbed in the filter, so that optimum amount of light may not be irradiated onto the medium. In this regard, the filter must provide an idealistic spectral transmission characteristic in order to avoid light absorption in the filter.

However, such idealistic optical filter is costly. If inexpensive optical filter having low grade spectral transmission characteristic is employed, light irradiation amount to the image recording medium may be lowered, and therefore, a desirable output image may not be obtainable on the developer medium.

SUMMARY OF THE INVENTION

It is therefore, an object of the present invention to overcome the above described drawbacks and to provide an improved image recording apparatus capable of producing sufficient output image despite of an employment of low grade filters which provide insufficient spectral transmission characteristics.

Another object of the invention is to provide such image recording apparatus which can compensate light irradiation onto an image recording medium, the light irradiation amount corresponding to the light absorption amount at the insufficient filters.

These and other objects of the invention will be attained by providing an image recording apparatus for producing an output color image on an image recording medium, the output image corresponding to an image of an original, the apparatus comprising: an exposure unit having a light source and providing an exposure zone, the exposure unit irradiating light from the light source toward the original and applying the light from the original toward the image recording medium positioned at the exposure zone for producing a latent image thereon, an optical path being defined from the light source to the exposure zone, an optical system provided between the light source and the exposure zone and at the optical path, the optical system having a color tone controlling member comprising optical filters, each of the filters being insertable and retractable with respect to the optical path, the filters defining a color tone of the output image in the image recording medium, a developer unit positioned downstream of the exposure zone for developing the latent image, and color tone compensation means for compensating the color tone defined by the filters, the compensating means being connected to the filters and controlling one of light irradiation amount of the light source and an exposure speed in accordance with an insertion amount of the optical filters with respect to the optical path.

The compensating means detects the insertion amounts of the filters. If the filters are largely inserted, the compensating means controls the light source to increase its light irradiation amount so as to compensate for the reduction in light irradiation of the recording medium which is caused by the filters. Alternatively, the compensating means decreases the exposure speed so that the light irradiation period per unit area of the image recording medium is prolonged, to thereby compensate for ruduction in light irradiation attendant to the large insertion of the filters.

DETAILED DESCRIPTION OF THE PREFERRED EMBODIMENTS

Figure 1:
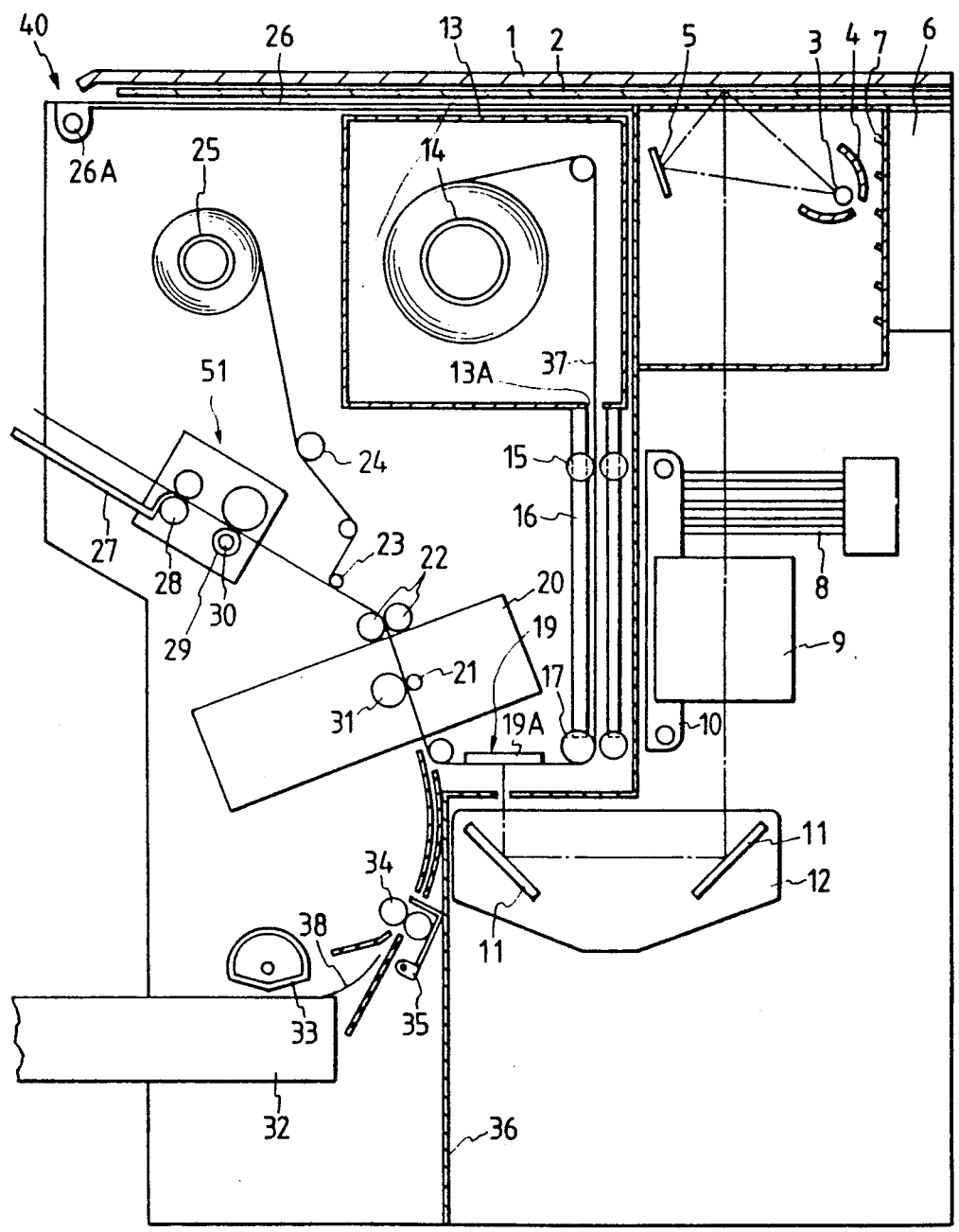
FIG. 1 is a schematic cross-sectional side view showing an image recording apparatus according to this invention.

FIG. 1 shows a copying machine capable of performing a full-color copying. This copying machine employs the above-described transfer type image recording mediums including a microcapsule sheet 37 and a developer sheet 38.

As shown in FIG. 1, the copying machine 40 generally includes an exposure unit 19 having an exposure stand 19A and a pressure developing unit 20. Further, a light shielding cover plate 36 is disposed in the apparatus to spacedly divide the apparatus into an optical system and other requisite units. The elongated weblike microcapsule sheet 37 is wound around a cartridge shaft 14, and is retained in a microcapsule sheet cartridge 13 that is detachably disposed at a position immediately below an original support stand glass 2 and is formed with a bottom opening 13A. In other words, the cartridge 13 storing therein non light exposed microcapsule sheet 37 is positioned at an upper portion of the apparatus 40. The exposure unit 19 is disposed below the sheet cartridge 13 at a downstream side thereof. The sheet 37 passes through a number of rollers and the pressure developing unit 20, and a leading end of the sheet 37 is attached to a take-up shaft 25 positioned beside the sheet cartridge 13.

Between the sheet cartridge 13 and the exposure unit 19, feed roller 15 and a barrel roller 17 are rotatably provided at a vertical sheet path for guide travel of the sheet toward the exposure unit. At the downstream side of the exposure unit 19, there is provided the pressure developing unit 20 which includes a small diameter roller 21 and a backup roller 31.

At a lower portion of the apparatus 40, there is provided a developer sheet cassette 32 for storing therein a stack of developer sheets 38. Immediately above the cassette 32, a sector roller 33 is provided to feed each one of developer sheet 38 toward the pressure developing unit 20. Between the cassette 32 and the pressure developing unit 20, a roller 34 and a resist-gate 35 are provided so as to align leading edge of the developer sheet 38.

At downstream side of the pressure developing unit 20, a pair of feed rollers 22 are provided so as to provide constant running speed of the microcapsule sheet 37. This speed is coincident with a horizontally moving speed of the original support stand glass 2.

At downstream side of the feed rollers 22, a separation roller unit 23 which provides a meandering sheet path is provided at which the microcapsule sheet 37 is separated from the developer sheet 38. The separate microcapsule sheet 37 is taken-up by the above mentioned take up means 25 through a meander travel control roller 24.

A thermal fixing unit 51 is provided at the downstream side of the separation roller 23. The thermal fixing unit 51 includes a heat roller 29 and a developer sheet feed roller 28. The heat roller 30 accommodates a heater 30 therein for heating the developer sheet 38 carrying an output color image. Further, a discharge tray 27 is provided at downstream side of the thermal fixing unit 51.

As shown in FIG. 1, the copying machine 40 has its top plate portion provided with a stand cover 1 and the original support stand glass 2. The original support stand glass 2 is formed of light transmissive material and is movable in the horizontal direction and on which a desired original (not shown) is to be placed. Further, an inner cover 26 is hingedly supported to a main frame as at 26a. At the upper one side section (right side in FIG. 1) of the copying machine 40, fixedly provided is a light source including a linear halogen lamp 3 extending in the direction perpendicular to the moving direction of the original support stand glass 2, and a semi-cylindrical reflector 4 disposed to surround the lamp 3. Further, additional reflector 5 is disposed in confrontation with the lamp 3 so as to reflectingly direct light toward the original, which light has not been initially directed toward the original. The light source emits a linear-line light ray to the original support stand glass 2.

Therefore, the light emitted from the halogen lamp 3 can be sequentially irradiated on the entire surface over the region from the one to another ends of the original support stand glass 2 in accordance with the horizontal movement of the glass 2. The light from the light source passes through the transparent original support stand glass 2 and is reflected at the original mounted thereon. The original support stand cover 1 which covers the top surface of the glass 2 is provided in order to prevent this light from leakage out of the apparatus.

At another side of the halogen lamp 3 there are provided a fan 6 and a louver 7 for introducing an external air into the apparatus. Accordingly, air is effectively impinged onto the light source 3 and the original support stand glass 2 to cool the same.

A filter unit 8 is disposed below the original support stand glass 2. Further, a lens unit 9 is provided below the filter unit 8. Light emitted from the halogen lamp 3 and reflected at the original placed on the original support stand glass 2 passes through the filter unit 8 and enters the lens 9. The filter unit 8 alters the light transmissive characteristic in accordance with the sensitivity characteristics of a microcapsule sheet 37, to thereby adjust the color tone of a copied output image. The lens 9 is fixedly secured to a lens mounting plate 10, and fine angular adjustment of this lens with respect to a light path is achievable. A pair of reflection mirrors 11 and 11 are provided below the lens 9. The condensed lights passing through the lens 9 change their direction by 180 degrees (completely reverse direction) by the two reflection mirrors 11 and the thus oriented lights impinge on the microcapsule sheet 37 closely contacting the bottom of the exposure table 19A to form the latent image thereon. The two reflection mirrors 11 are securely mounted to a mirror mounting plate 12, so that the adjustment of the length of the light path and focusing adjustment can be effected by fine adjustment of the position of the mirror mounting plate 12.

Figure 2:
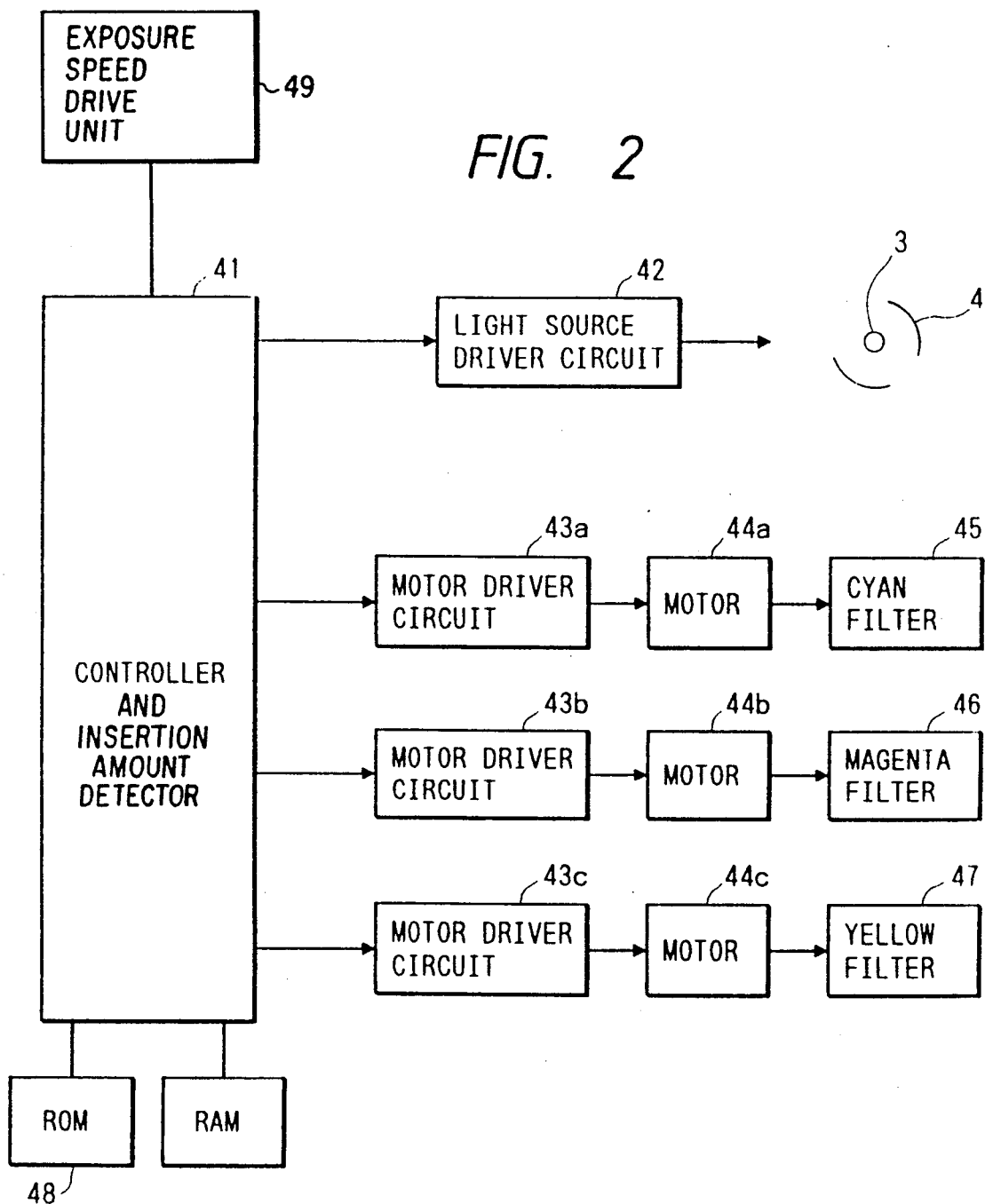
FIG. 2 is a block diagram showing a light amount controlling section according to this invention.

The filter unit 8 includes a cyan filter 45, a magenta filter 46 and a yellow filter 47 as shown in FIG. 2. Since these filters do not provide idealistic spectral transmission characteristics, the present invention further provides a color tone control means or compensating means so as to compensate the spectral transmission characteristics of the filters, to thereby finally control color tone appearing in the developer medium 38. The color tone control means includes a controller 41, a ROM 48, motor driver circuits 43a, 43b, 43c, motors 44a, 44b, 44c and a light source driver circuit 42. The motor driver circuit 43a has one end connected to the controller 41 and has another end connected to the drive motor 44a which is connected to the cyan filter 45. The motor driver circuit 43a controls drive motor 44a so as to control the insertion amount of the cyan filter relative to the light path. The same is true with respect to the remaining motor driver circuits 43b, 43c and the motors 44b, 44c. The ROM 48 is connected to the controller 41. In the ROM 48, stored is information regarding predetermined light transmission amount in accordance with insertion amount of each of the filters 45, 46 and 47. The controller 41 reads the information out of the ROM 48, and sends control signal to the light source driver circuit 42 in response to the insertion amount(s) of the filter(s). The light source driver circuit 42 is connected to the controller 41. The light source driver circuit 41 controls light irradiation amount of the light source 3 so as to compensate light attenuation provided by the filters. The controller 41 controls the light source driver circuit in response to the insertion amount(s) of the filter(s). Apparently, the color tone is varied in response to the filter insertion amount with respect to the optical path. The light irradiation from the light source to the original is performed during movement of the original, and the line of light reflected from the moving original passes along the light path shown in FIG. 1. In this case, since the original is moved, the original can be subjected to uniform filtering in spite of the partial overlapping of the filter with the line of light reflected from the original.

Operation of the copying apparatus will be described:

The microcapsule sheet 37 taken out through the opening 13A of the cartridge 13 is fed by the feed rollers 15 and guided by the barrel roller 17. The sheet 37 then passes in contact with a lower face of the exposure table 19A where original image carrying light is applied to the sheet 37, so that a latent image is formed on the sheet 37.

More specifically, the original support stand cover 1 is lifted up for mounting the original on the original support stand glass 2. Then, when a start button (not shown) is depressed, the original support stand glass 2 is moved to one direction (rightwardly in FIG. 1), so that one side edge of the glass 2 (left side edge in FIG. 1) stops at a first position where the one side edge of the glass 2 is comming into confrontation with the light source. Thereafter, with the halogen lamp 3 being lighted, the original support stand glass 2 is then moved in a second direction (leftwardly in FIG. 1) opposite to the first direction. The light emitted from the halogen lamp 3 is reflected at the original, and the reflected light passes through the filter unit 8 and lens 9 and is reflected at two reflection mirrors 11. The last reflected light is finally directed toward the microcapsule sheet 37 which is located under the exposure table 19A to form the latent image on the sheet 37. At this time, since the microcapsule sheet 37 is moved under the exposure table 19A in the second direction (leftwardly in FIG. 1) at the same speed as the moving speed of the original support stand glass 2, the latent image corresponding to the original image is formed on the microcapsule sheet 37. Since the conveying speed for the microcapsule sheet 37 is controlled to be constant by feed rollers 22 and is set equal to the moving speed of the original support stand glass 2, line latent images having given widths are sequentially formed on the microcapsule sheet 37 that is passing along the lower surface of the exposure table 19A.

During this exposure process, the color tone control means can provide optimum light irradiation amount of the light source 3 in accordance with the preset data stored in the controller 41 which data is indicative of the insertion amounts of the filters with respect to the vertical light path. Therefore, even if low grade filter is employed, its insufficient spectral transmission characteristics can be compensated by the color tone control means. More specifically, if the filters are largely inserted into the optical path, the controller 41 detects the insertion amount of the filters, and sends drive signal to the light source driver circuit 42, so that the light source 3 increases its light irradiation amount. Accordingly, even if the light irradiation amount onto the image recording medius is reduced when the light passes through the largely inserted filters, such reduction can be compensated by the increase in light irradiation amount of the light source 3 by means of the compensating means.

The sheet is then fed to the pressure developing unit 20 by the guide roller 17. At the pressure developing unit, the sheet 37 is pressurizingly superposed with the developer sheet 38. An unexposed portion of the microcapsule sheet 37 leaving the cartridge 13 is kept unexposed to light by the shielding cover 36. The developer sheets 38 are fed out one by one by the sector roller 33, and each sheet 38 is fed to a sheet inlet of the pressure developing unit 20 after leading edge of the sheet 38 is aligned by developer sheet rollers 34 and the resist gate 35.

Accordingly, the microcapsule sheet 37 and the developer sheet 38 are fed, in close contact therewith, to the pressure developing unit 20. The microcapsule-carrying surface of the microcapsule sheet 37 on which a latent image is formed contacts the developer-coated surface of the developer sheet 38 at a position inside the pressure developing unit 20, and these superposed sheets are pressed together by the small roller 21 and the backup roller 31. Unexposed microcapsules are ruptured by the applied pressure, to thereby form an output image on the developer sheet 38 because of the reaction of chromogenic material with the developer material.

In summary, in timed relation with the movement of the original support stand glass 2 in the second direction, the sector roller 33 feeds out the developer sheets 38 one by one from the developer sheet cassette 32. The developer sheet 37 superposed on the light-exposed microcapsule sheet 37 is fed to the pressure developing unit 20, and the latent image on the microcapsule sheet 37 is developed and transferred onto the developer sheet 38.

The microcapsule sheet 37 and developer sheet 38 leaving the pressure developing unit 20 are fed out by the feed rollers 22 and are separated by the separation roller 23, the former sheet 37 directing upward and the latter sheet 38 directing in the straight direction.

Thereafter, the developer sheet 38 is subjected to thermal fixing in the thermal fixing unit 51 and is then discharged onto the discharge tray 27. Meanwhile, the microcapsule sheet 37 leaving the pressure developing unit 20 and passing through the separation roller 23 and the meandering control roller 24 is wound around the take-up shaft 25. When the movement of the original support stand glass 2 is stopped at a second position where another edge (right side in FIG. 1) of the glass 2 confronts the the light source, the copying of the original is completed and the halogen lamp 3 is turned off.

The present invention is not limited to the above-described embodiment. For example, instead of the control to the light irradiation amount of the light source 3, exposure speed is controlled in accordance with the insertion amount of the filters. This exposure speed control can be made by controlling rotation speed of at least one of the feed roller 15, the barrel roller 17 and the feed rollers 22. For example, if the final light irradiation amount relative to the photosensitive pressure sensitive recording medium 37 is insufficient, the exposure speed is reduced. In this case, moving speed of the original support stand 2 is also synchronously reduced. For example, if the filters are largely inserted into the optical path, the controller detects the insertion amounts and controls, in response to the detection, an exposure speed driving unit (49) which determines the exposure speed, i.e., travelling speed of the image recording medium and the moving speed of the original, so that the exposure speed is lowered, to thereby prolong exposure period per unit area of the image recording medium. As a result, even if the light irradiation amount onto the medium is reduced due to the largely inserted filters, such reduction can be compensated by the prolonted exposure by means of the compensating means.

In view of the above, according to the present invention, light irradiation amount of the light source or the exposure speed is controlled in accordance with the insertion amount of the filters. Accordingly, it becomes possible to obtain high quality output image provided with a desirable color balance in spite of the employment of the filters having insufficient spectral transmission characteristics. As a result, image recording operation can be made at low cost.

While the invention has been described in detail and with reference to specific embodiment, it would be apparent for those skilled in the art that various changes and modifications can be made therein without departing from the spirit and scope of the invention.

What is claimed is:

1. An image recording apparatus for producing an output color image on an image recording medium, the output image corresponding to an image of an original, the apparatus comprising:

an exposure unit having a light source and providing an exposure zone, the exposure unit irradiating light from the light source toward the original and applying the light from the original toward the image recording medium positioned at the exposure zone for producing a latent image thereon, an optical path being defined from the light source to the exposure zone;

an optical system provided between the light source and the exposure zone and at the optical path, the optical system having a color tone controlling member comprising optical filters, each of the filters being insertable and retractable with respect to the optical path, the filters defining a color tone of the output image in the image recording medium;

a developer unit positioned downstream of the exposure zone for developing the latent image; and color tone compensation means for compensating the color tone defined by the filters, the compensating means being connected to the filters and controlling one of light irradiation amount of the light source and an exposure speed in accordance with an insertion amount of the optical filters with respect to the optical path.

2. The image recording apparatus as claimed in claim 1 wherein the image recording medium comprises a first image recording medium and a second image recording medium, the first image recording medium comprising a photosensitive pressure sensitive recording medium provided with microcapsules, the microcapsules encapsulating therein a first material having first and second phases dependent on light exposure, and the second image recording medium comprising a developer medium provided with a second material which provides an output image upon reaction with the first material, the latent image being provided on the first image recording medium, and the output image having the controlled color tone is provided on the second image recording medium.

3. The image recording apparatus as claimed in claim 2, wherein the filters comprise a cyan filter, a magenta filter and a yellow filter, and wherein the optical system further comprises at least three drive means connected to the filters for moving the filters with respect to the optical path.

4. The image recording apparatus as claimed in claim 3 wherein the color tone compensation means comprises a means for controlling the light irradiation amount of the light source, the controlling means comprising a controller, a light source driver circuit having one end connected to the controller and another end connected to the light source, the drive means being connected to the controller, so that the controller controls the light source driver circuit in response to the insertion amount of the filters relative to the optical path.

5. The image recording apparatus as claimed in claim 3, further comprising feeding means for feeding the first image recording medium, the first image recording medium being travelled through the exposure zone at a speed defined by the feeding means; and means for moving the original at a speed equal to the travelling speed of the first image recording medium; and wherein the color tone compensating means comprises a means for controlling the feeding speed of the feeding means and moving speed of the original moving means for controlling the exposure speed in accordance with the insertion amount of the filters.

* * * * *